United States Patent
de Vries

(10) Patent No.: US 10,141,898 B2
(45) Date of Patent: Nov. 27, 2018

(54) HIGH CURRENT LOW-COST DC COUPLED DAC FOLLOWER LOW PASS FILTER HEADPHONE AMPLIFIER

(71) Applicant: Tymphany HK Limited, Hong Kong (CN)

(72) Inventor: Sebastiaan de Vries, Donggua Ling (CN)

(73) Assignee: TYMPHANY HK LIMITED, Hong Kong (CN)

( * ) Notice: Subject to any disclaimer, the term of this patent is extended or adjusted under 35 U.S.C. 154(b) by 0 days.

(21) Appl. No.: 15/606,211

(22) Filed: May 26, 2017

(65) Prior Publication Data

US 2017/0347195 A1    Nov. 30, 2017

Related U.S. Application Data

(60) Provisional application No. 62/341,963, filed on May 26, 2016.

(51) Int. Cl.

| | |
|---|---|
| *H03F 1/56* | (2006.01) |
| *H03F 3/183* | (2006.01) |
| *H03F 3/45* | (2006.01) |
| *H04R 3/00* | (2006.01) |
| *H03F 1/32* | (2006.01) |
| *H03F 3/185* | (2006.01) |
| *H03F 1/02* | (2006.01) |
| *H03F 1/08* | (2006.01) |
| *H03F 3/08* | (2006.01) |
| *H03F 3/60* | (2006.01) |
| *H04R 5/033* | (2006.01) |

(Continued)

(52) U.S. Cl.
CPC ............. *H03F 1/56* (2013.01); *H03F 1/0227* (2013.01); *H03F 1/083* (2013.01); *H03F 1/3205* (2013.01); *H03F 1/3211* (2013.01); *H03F 3/087* (2013.01); *H03F 3/183* (2013.01); *H03F 3/185* (2013.01); *H03F 3/187* (2013.01); *H03F 3/45475* (2013.01); *H03F 3/601* (2013.01); *H03F 3/68* (2013.01); *H04R 3/00* (2013.01); *H04R 3/005* (2013.01); *H04R 5/033* (2013.01); *H04R 5/04* (2013.01); *H03F 2200/03* (2013.01); *H03F 2200/387* (2013.01)

(58) Field of Classification Search
USPC .................................................. 381/120–121
See application file for complete search history.

(56) References Cited

U.S. PATENT DOCUMENTS

| | | | | |
|---|---|---|---|---|
| 4,688,258 | A * | 8/1987 | Kunugi | .................. H03G 5/165 381/102 |
| 5,260,704 | A * | 11/1993 | Hustig | .................... G06F 17/17 341/144 |
| 2005/0089175 | A1 | 4/2005 | Van Tassel | |

* cited by examiner

*Primary Examiner* — Disler Paul
(74) *Attorney, Agent, or Firm* — Cantor Colburn LLP

(57) ABSTRACT

A digital-to-analog converter (DAC) circuit includes a pair of output stages, each including a DAC configured to convert a digital audio signal into an analog audio signal. A low-pass filter circuit includes an operational amplifier in signal communication with the DAC. The operation amplifier generates a filtered analog signal based on the analog audio signal. An amplifier network generates an amplified audio signal based on the filtered analog signal. The operational amplifier includes a feedback circuit path including a first node connected to the output of the amplifier network and a second node connected to the input of the operational amplifier. The amplifier network is electrically nested in the feedback circuit path.

3 Claims, 11 Drawing Sheets

(51) Int. Cl.
*H04R 5/04* (2006.01)
*H03F 3/187* (2006.01)
*H03F 3/68* (2006.01)

HIGH CURRENT LOW-COST DC COUPLED DAC FOLLOWER LOW PASS FILTER HEADPHONE AMPLIFIER

CROSS-REFERENCE TO RELATED APPLICATIONS

The present application claims priority to U.S. Provisional Application No. 62/341,963, filed on May 26, 2016, the contents of which are incorporated by reference herein in its entirety.

BACKGROUND

The present disclosure relates to audio applications, and more specifically, to audio amplifier circuits.

Conventional audio amplifiers typically require switchable microphone lines that provide low current DC output or are highly expensive. In digital audio systems, for example, headphone output lines typically require a digital to analog converter (DAC) to convert the digital output signal into an analog audio signal that can be output from the headphones. The DAC typically requires a low pass filter circuit to filter out of audio-band high frequency noise. To achieve the audio-band high frequency noise filtering process, conventional systems employ a separate low pass filter stage, followed by a second separate headphone amplifier stage.

SUMMARY

According to one embodiment, pre-amplifier circuit is provided including a microphone pre-amplifier stage. The microphone pre-amplifier stage including a direct injection (DI) unit that provides a high impedance source signal and a low impedance XLR connection operable without a line or mic switch. The pre-amplifier circuit further includes self-biasing input component (e.g., transistor pairs) that bias input to an analog-to-digital converter (ADC). In this manner, a low cost, high current DC coupled headphone output is provided.

According to another non-limiting embodiment, a digital-to-analog converter (DAC) circuit includes a pair of output stages, each including a DAC configured to convert a digital audio signal into an analog audio signal. A low-pass filter circuit includes an operational amplifier in signal communication with the DAC. The operation amplifier generates a filtered analog signal based on the analog audio signal. An amplifier network generates an amplified audio signal based on the filtered analog signal. The operational amplifier includes a feedback circuit path including a first node connected to the output of the amplifier network and a second node connected to the input of the operational amplifier. The amplifier network is electrically nested in the feedback circuit path.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Various non-limiting embodiments described herein provide a "voltage-out" Digital to Analogue converter IC (DAC) follower low-pass filter with high current Direct Coupled output-stage. The DAC of the present disclosure capable of generating low impedance such that the DAC can be directly coupled to an analog component such as, for example, audio headphones. The term "directly coupled" refers to the DAC's capability to connect directly to audio headphones at the output-stage without DC block capacitors in series with the output signal. Accordingly, the DAC circuit is capable of connecting directly to a voltage-out Digital to Analogue converter integrated circuit (IC). The capability to directly couple the audio headphones, for example, allows for the omission of output capacitors from the output stage design. Accordingly, the frequency response dependency on the impedance of the connected headphone caused by the output capacitors found in conventional audio systems is eliminated.

Figure 1:
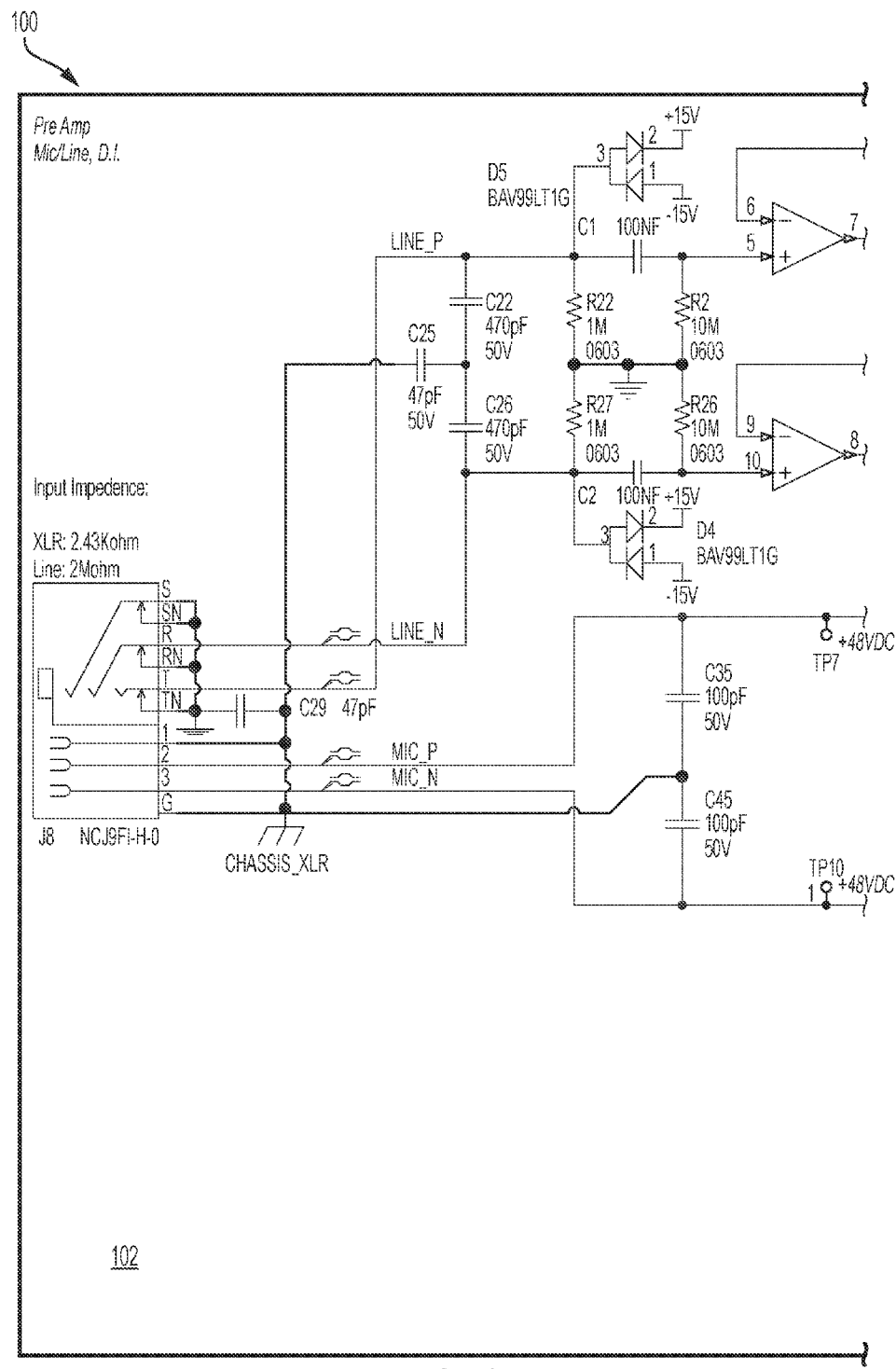
FIG. 1 is a schematic of a pre-amplifier circuit including a microphone pre-amplifier stage having a high-impedance DI unit and low impedance XLR connector that may be operated without line/mic switch according to a non-limiting embodiment.
Figure 1:
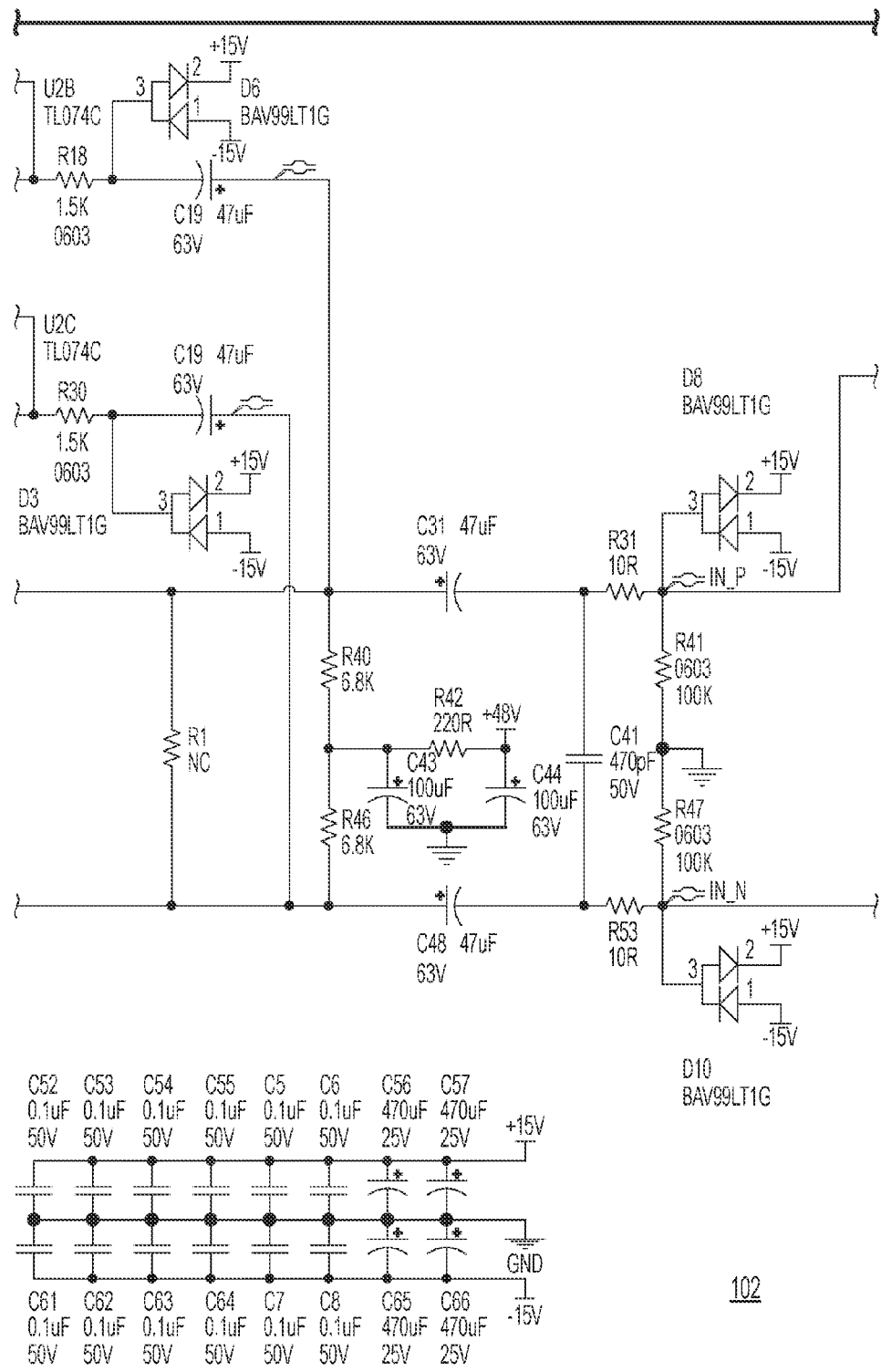
Figure 1:
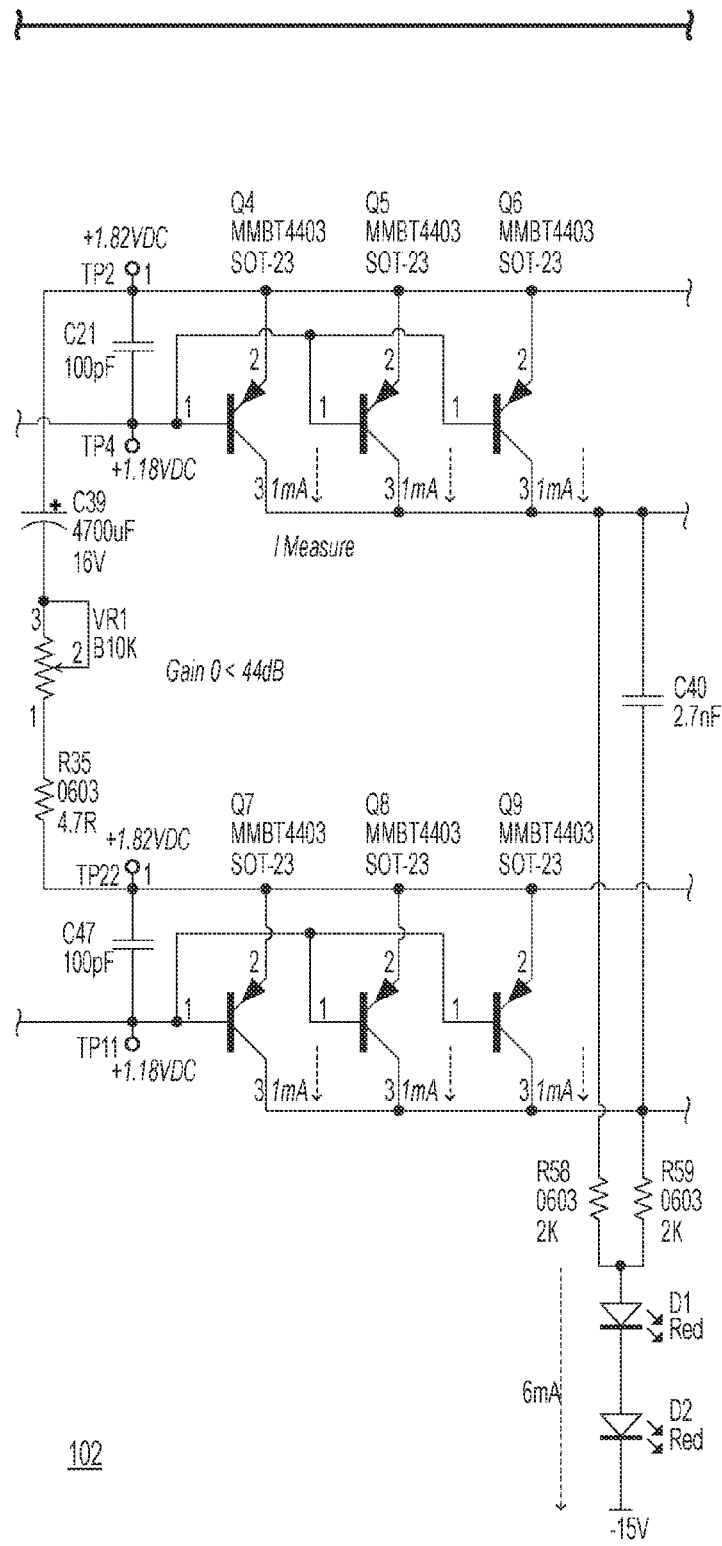
Figure 1:
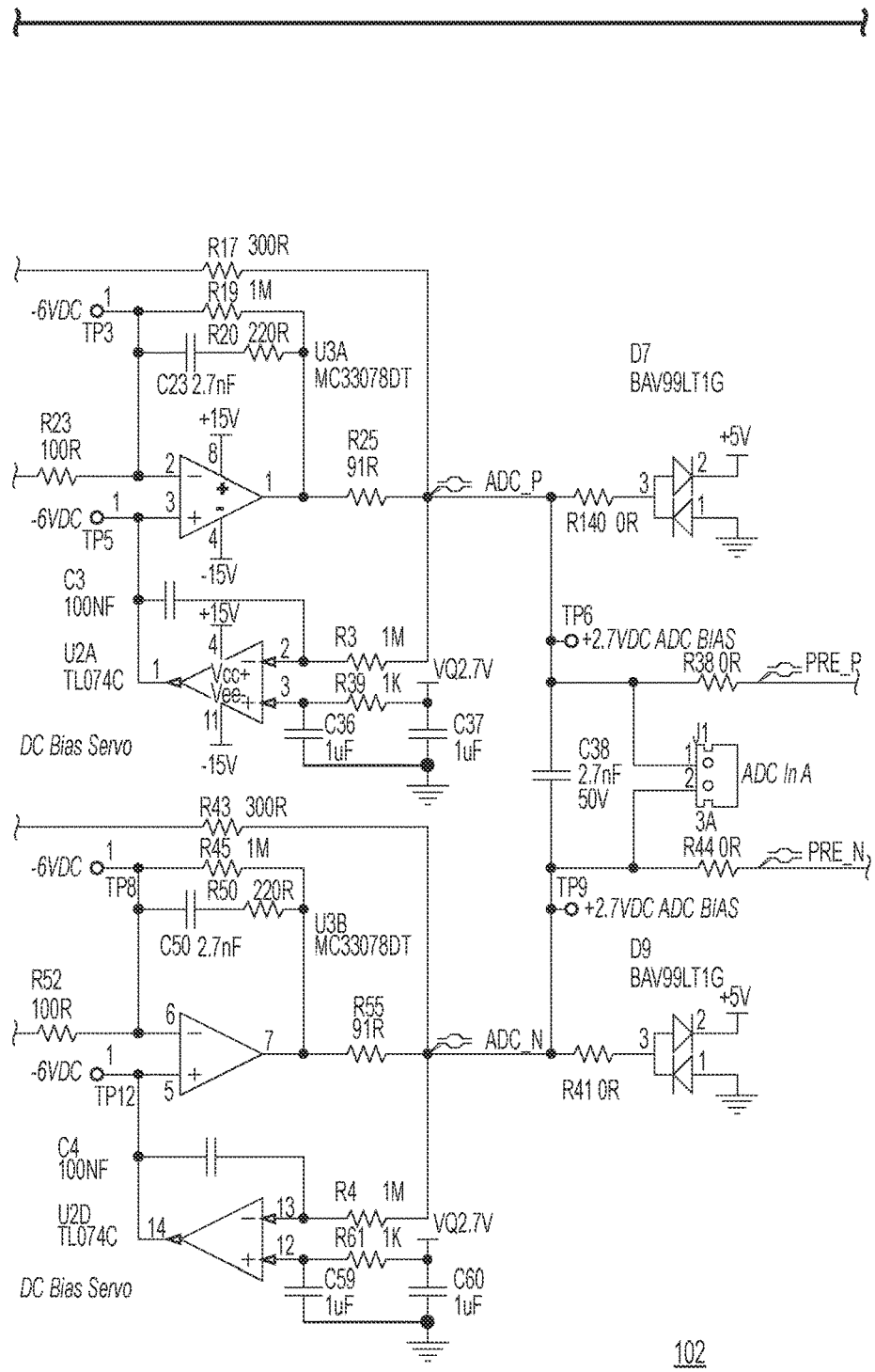
Figure 1:
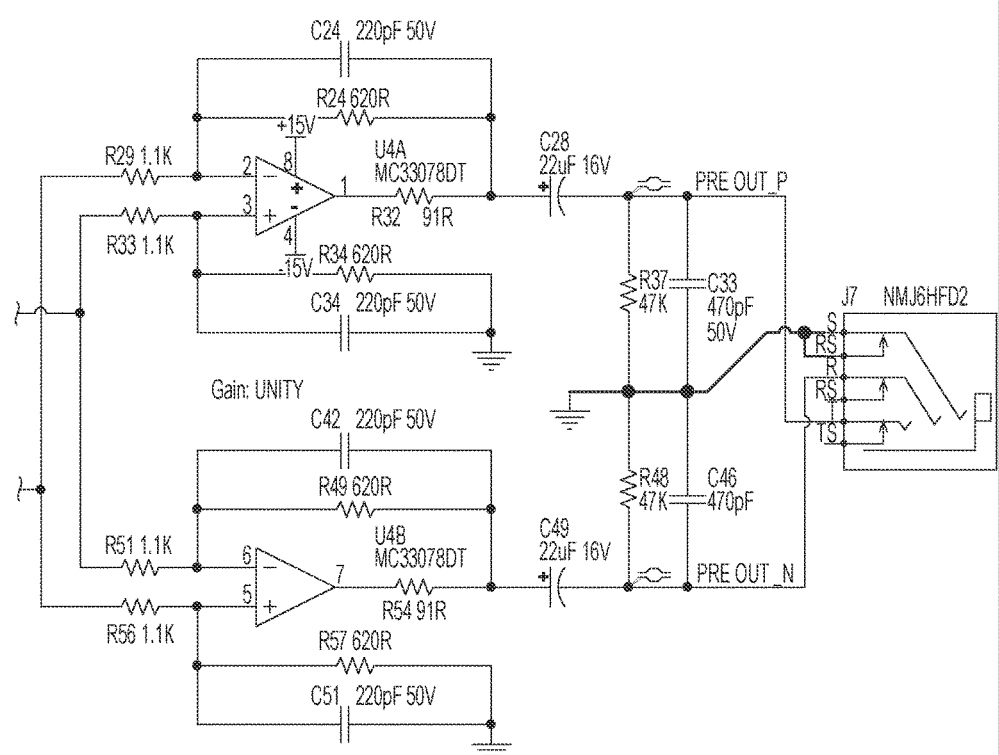
Figure 1:
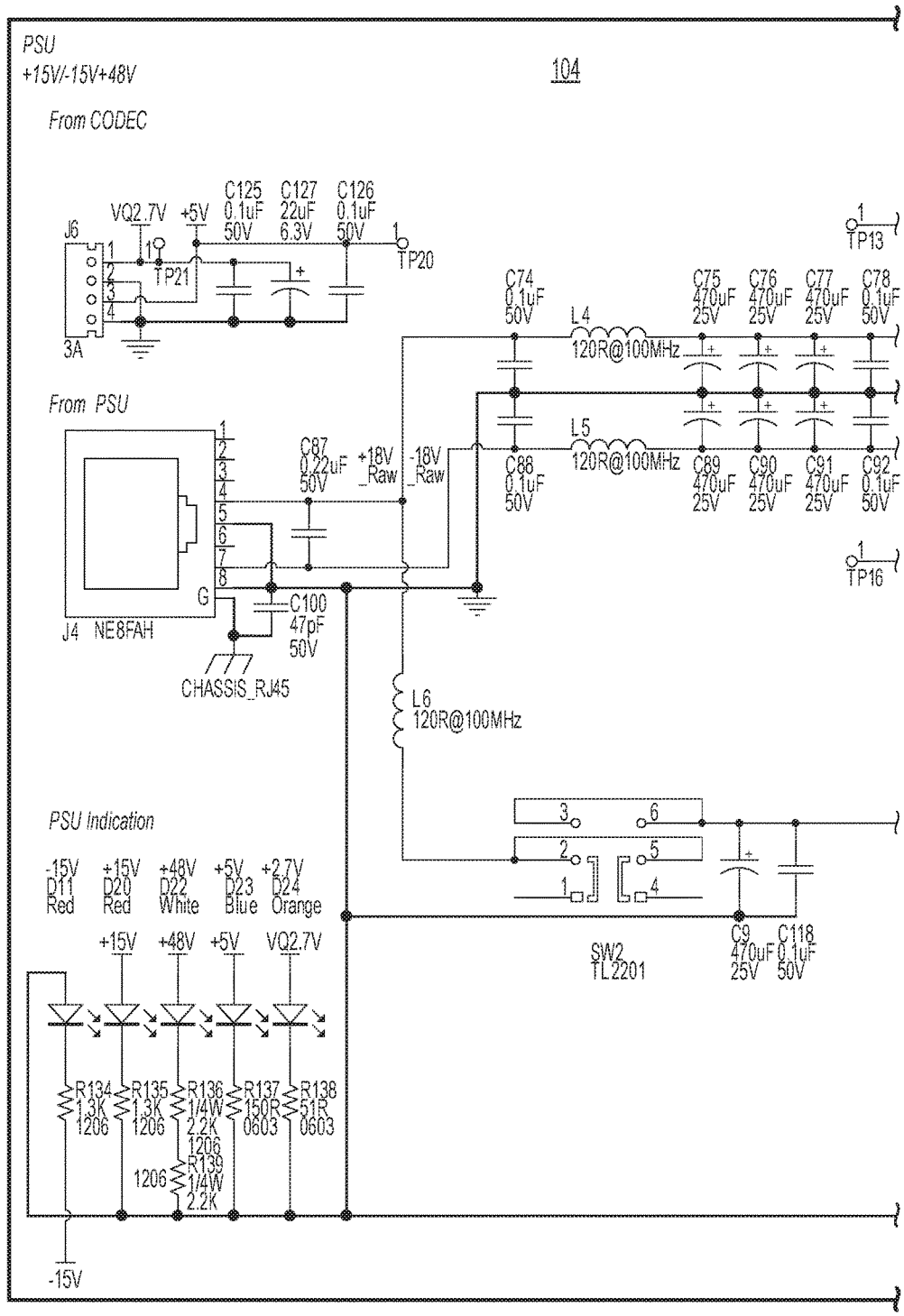
Figure 1:
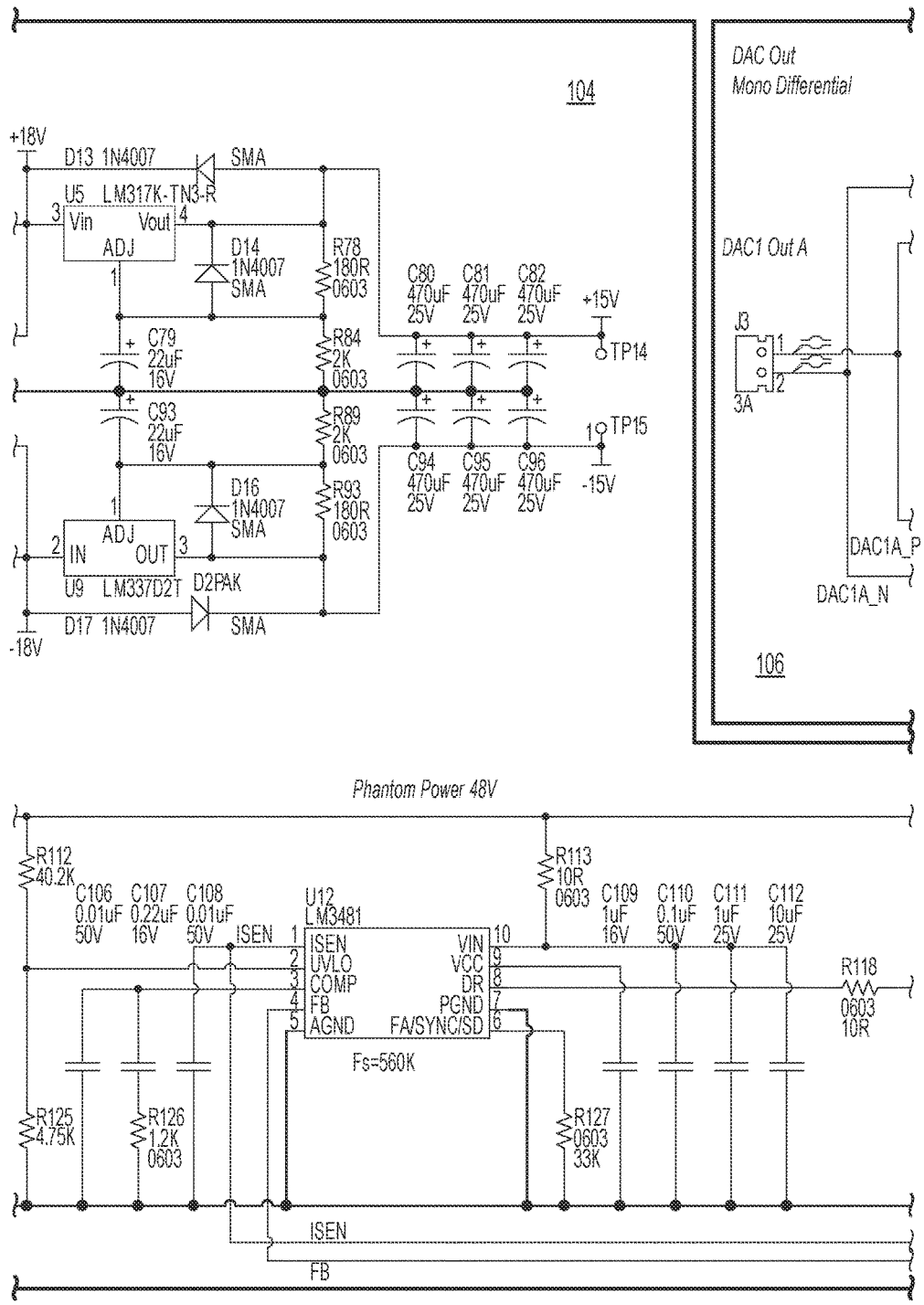
Figure 1:
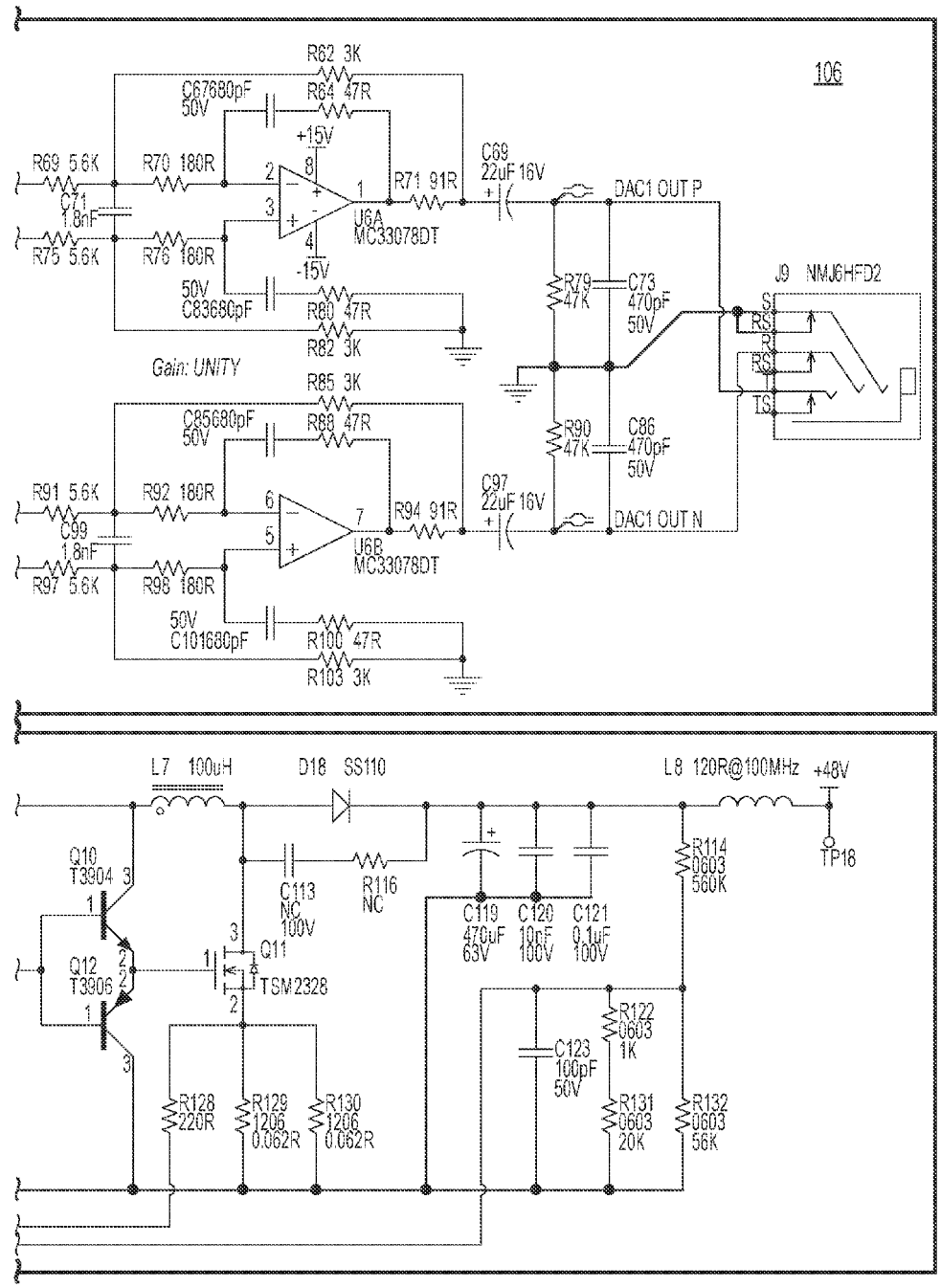
Figure 1:
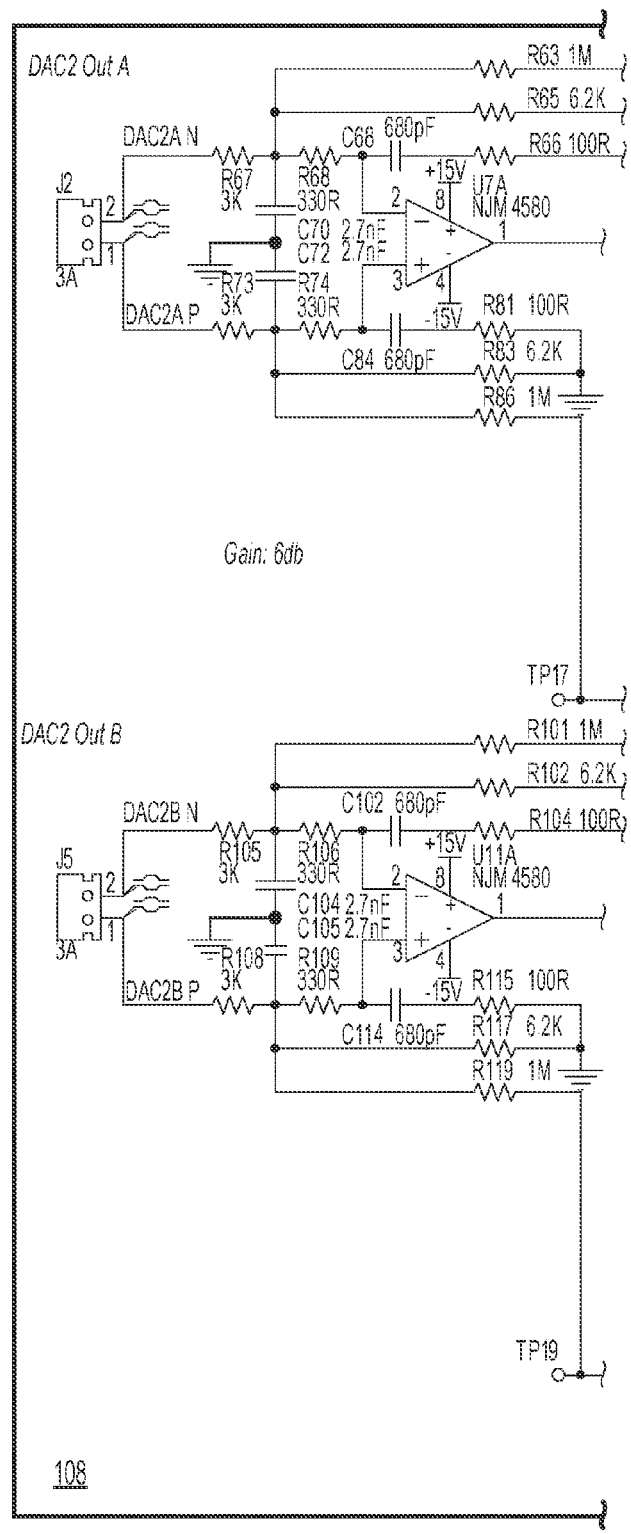
Figure 1:
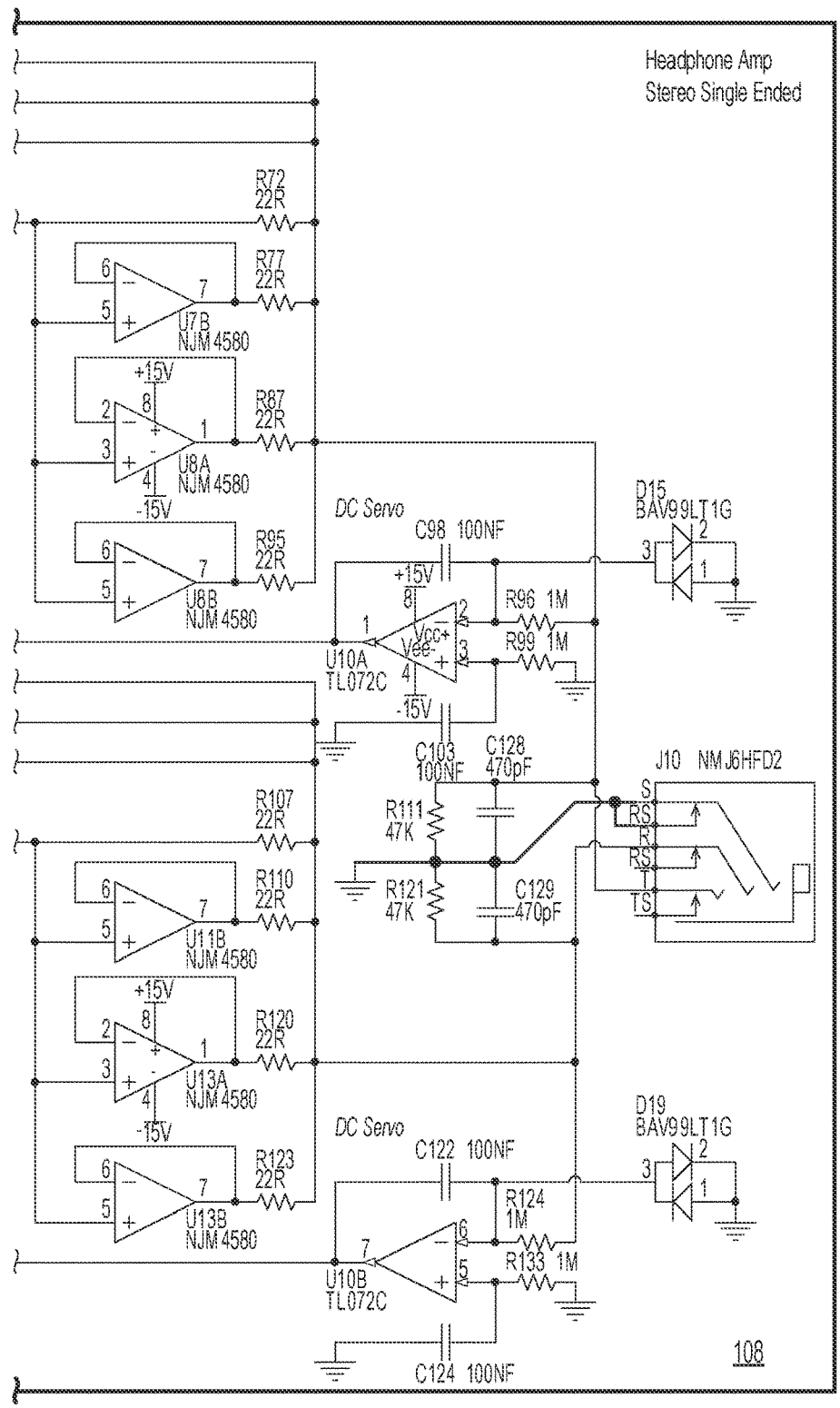

Referring to FIG. 1, a pre-amplifier circuit 100 is illustrated according to a non-limiting embodiment. The pre-amplifier circuit 100 includes a microphone pre-amplifier stage 102 (i.e., circuit), a PSU 104, a digital-to-analog converter stage 106, and a headphone amplifier stage (108). The microphone pre-amplifier stage includes a direct injection (DI) unit that provides a high impedance source signal and a low impedance XLR connection operable without a line or mic switch. The DI unit may connect a high-impedance source signal (e.g. high-impedance, line level, unbalanced source signal) to a low-impedance, microphone level, balanced input. The XLR connection may include an XLR electrical connector that connects the high-impedance source signal to the low-impedance, microphone input to provide a balanced audio interconnection.

According to a non-limiting embodiment, the DI unit may provide electrical ground isolation between input and output, and they match the impedance of the source signal to that of a load. For example, a DI unit may be implemented with a high input impedance and a low output impedance may be used to match an input device (e.g., guitar, bass, etc.) to the input stage of a second device (e.g., mixing device). In at least one embodiment, the DI unit is an active electrical DI unit that receives phantom power output generated by the PSU 104.

The pre-amplifier circuit further includes self-biasing input component (e.g., transistor pairs) that bias input to an analog-to-digital converter (ADC). The self-biasing input components may be implemented as junction gate field effect transistor (JFET) pairs or operation amplifier pairs. In this manner, a low cost, high current DC coupled headphone output is provided.

Figure 2:
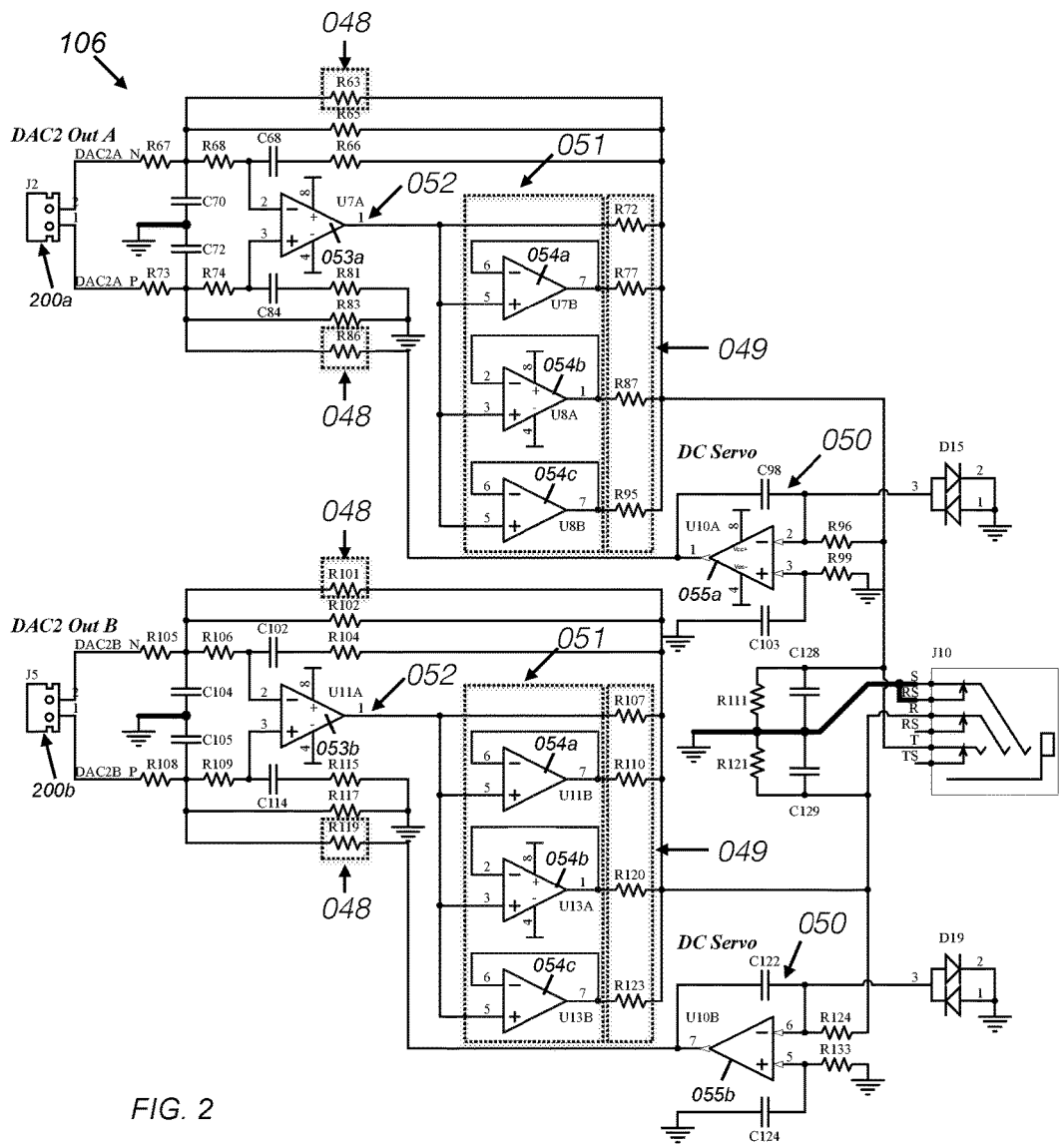
FIG. 2 is a schematic diagram of a DAC circuit according to a non-limiting embodiment.

Turning now to FIG. 2, the digital-to-analog converter (DAC) stage 106 will be described in greater detail. The DAC stage 106 (i.e., DAC circuit 106) converts an output digital signal into an analog signal, which can then be used by an analog output device such as, for example, audio headphones. Unlike conventional audio systems, however, the DAC circuit 106 is capable of filtering the audio-band high frequency noise without requiring a separate low pass filter stage, followed by a second separate headphone amplifier stage.

The DAC circuit 106 includes a first output stage (DAC2 Out A) and a second output stage (DAC Out B). Each output stage (DAC2 Out A and DAC2 Out B) includes a first operation amplifier (OpAmp) circuit 052 and a second OpAmp circuit 051. In at least one non-limiting embodiment, two dual channel OpAmps can be employed. In another embodiment, a single quad channel OpAmp can be employed. The first OpAmp 052 circuit is configured as a low-pass filter circuit. The inverting pin 2 of OpAmp 053 is connected to a first output (DAC2A N) of the DAC 200. The non-inverting pin 3 of the OpAmp 053 is connected to a second output (DAC2A P) of the DAC 200. The output pin 1 of the OpAmp 053a/053b is connected to the second OpAmp circuit 051. In at least one embodiment, the OpAmp circuit 052 includes a feedback circuit path. The feedback circuit path includes a first node connected to the output of the second OpAmp circuit 05 and a second node connected to the input of the OpAmp circuit 052 (e.g., the inverting input pin of the OpAmp 053a/053b).

The second OpAmp circuit 051 includes a first unity gain OpAmp 054a, a second unity gain OpAmp 054b, and a third unity gain OpAmp 054c. The first unity gain OpAmp 054a, second unity gain OpAmp 054b, and third unity gain OpAmp 054c are each connected to the output pin 1 of OpAmp 053a/053b to receive the filtered output signal.

The three unity gain OpAmps 054a, 054b and 054c are nested inside a feedback loop defined by the first OpAmp circuit 052. Accordingly, the DAC circuit 106 is capable of delivering four times (4×) the current of an ordinary single op-amp low pass stage.

Each output stage (DAC2 Out A and DAC2 Out B) 106 further includes a load sharing resistor network 049a and 049b, respectively. The first sharing resistor network 049a includes resistors R72, R77, R87 and R95. The second sharing resistor network 049 includes resistors R107, R110, R120 and R123. The first sharing resistor network 049a is configured to prevent currents circulating between the unity gain OpAmps 054a, 054b and 054c included in the first output stage DAC2 Out A. The second sharing resistor network 049b is configured to prevent currents circulating between the unity gain OpAmps 054a, 054b and 054c included in the second output stage DAC2 Out B.

The first output stage (DAC2 Out A) and the second output stage (DAC2 Out B) each include an integrator DC servo circuit 050 configured to generate a low impedance. In this manner, the DAC circuit 106 can be connected directly to an analog component such as audio headphones, for example, without the need to implement separate conventional DC block capacitors.

A first DC servo circuit 050 includes a first OpAmp 055a and a second DC servo circuit 050 includes a second OpAmp 055b. The first and second OpAmps 055a and 055b generate a virtual ground reference point which and operates in conjunction with resistors 048a and 048b, respectively, to generate the impedance applied to the non-inverting input of OpAmps 053a and 053b, respectively. The inverting input of OpAmps 053a and 053b has the same resistor values as the non-inverting input, 048a and 048b, respectively, to equalize the input impedance of the first operation amplifier (OpAmp) circuit 052 in the first and second output stages (DAC2 Out A and DAC2 Out B), respectively. The DC servo circuits 050 are configured with equalized impedances for inverting and non-inverting inputs. Accordingly, the DC offset is maintained as low as possible and avoids missmatch of the input legs of a respective DC servo circuit 050.

As presented above, various non-limiting embodiments provide a DAC circuit 106 that includes gain OpAmp buffers 051 that are nested inside a respective feedback-loop of a low pass filter circuit defined by the first OpAmp circuits 052. The DC servo circuits 050 are also designed as part of an impedance equalized differential low pass input stage where the virtual ground of the DC servo integrator output 050 is utilized as part of the overall design. The DC servo circuits also ensure that there is no DC voltage or DC leakage at the headphone amplifier output stage. Also, the DAC circuit 106 provides a single circuit block configured to perform low-pass filtering for a voltage output DAC converter, and current buffering which drives low impedance headphones without the use of a second separate filtering stage provided by conventional output stage filtering capacitors.

As used herein, the term "module" refers to an application specific integrated circuit (ASIC), an electronic circuit, a microprocessor, a computer processor (shared, dedicated, or group) and memory that executes one or more software or firmware programs, a combinational logic circuit, a microcontroller including various inputs and outputs, and/or other suitable components that provide the described functionality. The module is configured to execute various algorithms, transforms, and/or logical processes to generate one or more signals of controlling a component or system. When implemented in software, a module can be embodied in memory as a non-transitory machine-readable storage medium readable by a processing circuit (e.g., a microprocessor) and storing instructions for execution by the processing circuit for performing a method. A controller refers to an electronic hardware controller including a storage unit capable of storing algorithms, logic or computer executable instruction, and that contains the circuitry necessary to interpret and execute instructions.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:
1. A digital-to-analog converter (DAC) circuit comprising:
  a pair of output stages, each output stage comprising:
    a DAC configured to convert a digital audio signal into an analog audio signal;

an low-pass filter circuit including an operational amplifier in signal communication with the DAC, the operation amplifier configured to generate a filtered analog signal based on the analog audio signal; and an amplifier network in signal communication with the operational amplifier to generate an amplified audio signal based on the filtered analog signal, wherein the operational amplifier includes a feedback circuit path including a first node connected to the output of the amplifier network and a second node connected to the input of the operational amplifier, wherein the amplifier network is electrically nested in the feedback circuit path, and wherein each output stage includes a DC servo circuit configured to equalize an impedance of the operational amplifier.

2. The DAC circuit of claim 1, wherein the DC servo circuit includes an output in signal communication with the low-pass filter circuit, and wherein the DC servo circuit generates a ground reference point to control the impedance of the operational amplifier.

3. The DAC circuit of claim 2, wherein the amplifier network includes a plurality of operational gain operational amplifiers connected in parallel with one another.

* * * * *